(12) United States Patent
Hammen et al.

(10) Patent No.: US 9,831,070 B1
(45) Date of Patent: Nov. 28, 2017

(54) SURFACE TREATER WITH EXPANSION ELECTRODE ARRANGEMENT

(71) Applicant: Enercon Industries Corporation, Menomonee Falls, WI (US)

(72) Inventors: Richard R. Hammen, Waupaca, WI (US); Jacob W. Hanson, Menomonee Falls, WI (US)

(73) Assignee: Enercon Industries Corporation, Menomonee Falls, WI (US)

( * ) Notice: Subject to any disclaimer, the term of this patent is extended or adjusted under 35 U.S.C. 154(b) by 0 days.

(21) Appl. No.: 15/624,591

(22) Filed: Jun. 15, 2017

(51) Int. Cl.
  *H01J 1/02* (2006.01)
  *H01J 37/32* (2006.01)
  *B32B 38/00* (2006.01)
  *B05D 3/14* (2006.01)

(52) U.S. Cl.
  CPC .... *H01J 37/32568* (2013.01); *H01J 37/3277* (2013.01); *B05D 3/142* (2013.01); *B32B 38/0008* (2013.01)

(58) Field of Classification Search
  USPC ................................................ 313/147, 146
  See application file for complete search history.

(56) References Cited

U.S. PATENT DOCUMENTS

| | | |
|---|---|---|
| 4,533,523 A | 8/1985 | Ahlbrandt |
| 4,564,759 A | 1/1986 | Tietje |
| 4,575,329 A | 3/1986 | Ahlbrandt |
| 4,701,590 A | 10/1987 | Hatch |
| 4,724,507 A | 2/1988 | Ahlbrandt |
| 4,774,061 A | 9/1988 | Ahlbrandt |
| 4,777,577 A | 10/1988 | Bingham et al. |
| 5,208,442 A | 5/1993 | Ahola et al. |
| 5,278,409 A | 1/1994 | Bonner |
| 5,281,174 A | 1/1994 | Bonner |
| 5,293,043 A | 3/1994 | Bonner |
| 5,332,897 A | 7/1994 | Stobbe et al. |
| 5,437,844 A | 8/1995 | Bonner |
| 6,007,784 A | 12/1999 | Jorgensen |
| 6,096,993 A | 8/2000 | Marhic et al. |
| 6,299,948 B1 | 10/2001 | Gherardi et al. |
| 6,361,748 B1 | 3/2002 | Prinz et al. |
| 6,410,879 B1 | 6/2002 | Schwankhart |
| 6,429,595 B1 | 8/2002 | Hammen et al. |
| 6,624,413 B1 | 9/2003 | Klein |
| 6,894,279 B2 | 5/2005 | Washebeck et al. |
| 6,987,237 B2 | 1/2006 | Walters |

(Continued)

FOREIGN PATENT DOCUMENTS

| | | |
|---|---|---|
| EP | 0095051 A1 | 11/1983 |
| EP | 1388375 A2 | 2/2004 |

(Continued)

OTHER PUBLICATIONS

Enercon, Ceramic Electrode Corona Treaters for Films, pp. 1-3, Retrieved via Internet on May 24, 2017. (http://www.enerconind.com/treating/corona/products/ceremic-electrodes/aspx).

(Continued)

*Primary Examiner* — Vip Patel
(74) *Attorney, Agent, or Firm* — LKGlobal | Lorenz & Kopf, LLP

(57) ABSTRACT

An expansion mount, electrode arrangement and a surface treater station include a mounting block with one or more clamps pivotally coupled to the mounting block to move between a connect position and a release position. When the mounting block is coupled to a surface treater, the one or more clamps are configured to engage the electrode in the connect position and disengage from the electrode in the release position.

20 Claims, 8 Drawing Sheets

(56) References Cited

U.S. PATENT DOCUMENTS

| | | |
|---|---|---|
| 7,112,759 B1 | 9/2006 | Severance, Jr. |
| 7,859,180 B2 | 12/2010 | Prinz et al. |
| 7,979,034 B2 | 7/2011 | Khannur et al. |
| 8,709,351 B2 | 4/2014 | Hammen et al. |

FOREIGN PATENT DOCUMENTS

| | | |
|---|---|---|
| EP | 1746696 A1 | 1/2007 |
| EP | 2280459 A1 | 2/2011 |
| EP | 2574446 A1 | 4/2013 |
| EP | 2384096 A3 | 3/2014 |
| GB | 2022323 A | 12/1979 |
| GB | 2340434 B | 10/2000 |
| WO | 0219486 A1 | 3/2002 |

OTHER PUBLICATIONS

Enercon, CoronaFlex Corona Treater, pp. 1-3, Retrieved via Internet on May 24, 2017. (http://www.enerconind.com/treating/corona/products/coronoaflex/aspx).

Vetaphone, Vetaphone VE1C Corona Treater—Quick Change Electrode Cartridge, Uploaded Jun. 1, 2008, Retrieved via YouTube on Jun. 13, 2017. (https://www.youtube.com/watch?v=Geoo3WBpBv8).

Corona Supplies Ltd, Cleaning Ceramic Electrodes, Published Dec. 14, 2012, Retrieved via YouTube on Jun. 13, 2017. (https://www.youtube.com/watch?v=LhuCy3DRWqM).

Aliexpress, Anti-collision torch holder for plasma torch, retrieved from the Internet at: https://www.aliexpress.com/store/product/anti-collision-torch-holder-for-plasma-torch/717094_712089358.html., copyright 2010-2016.

Pillar Technologies, Universal Surface Treaters, retrieved from the Internet at: http://www.pillartech.com/Surface-Treatment/Surface-Treaters/Universal-Treaters, copyright 2017.

Ahlbrandt: Corona Treatment, retrieved from the Internet at: https://www.ahlbrandt.de/en/corona-treatment/corona-treatment/, copyright 2016.

QC Electronics, Corona Treaters, retrieved from the internet at: http://www.qcelectronics.com/corona-treaters.html. Copyright 2015.

Vetaphone Corona & Plasma, Products, retrieved from the Internet at: http://www.vetaphone.com/products/, copyright 2016.

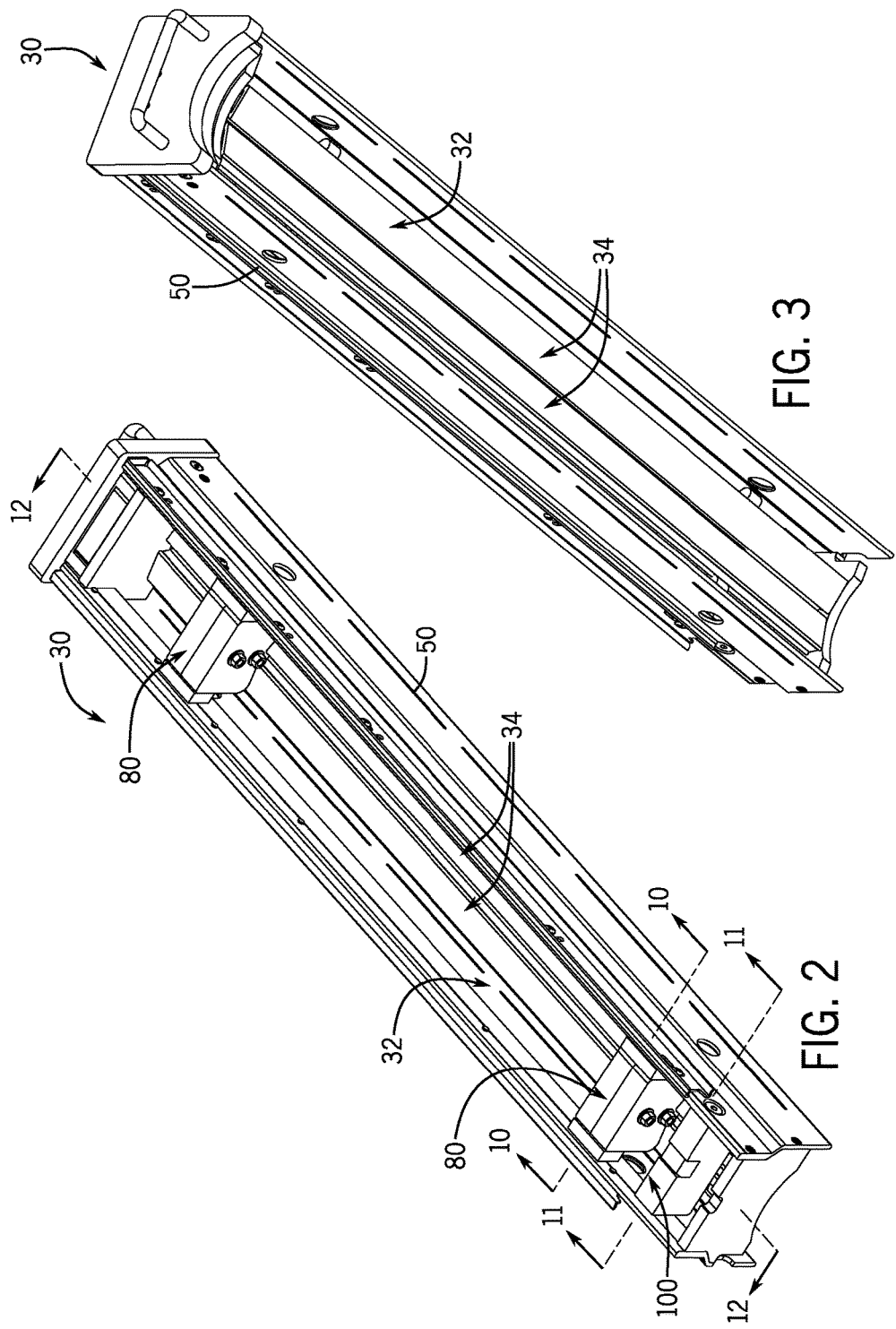

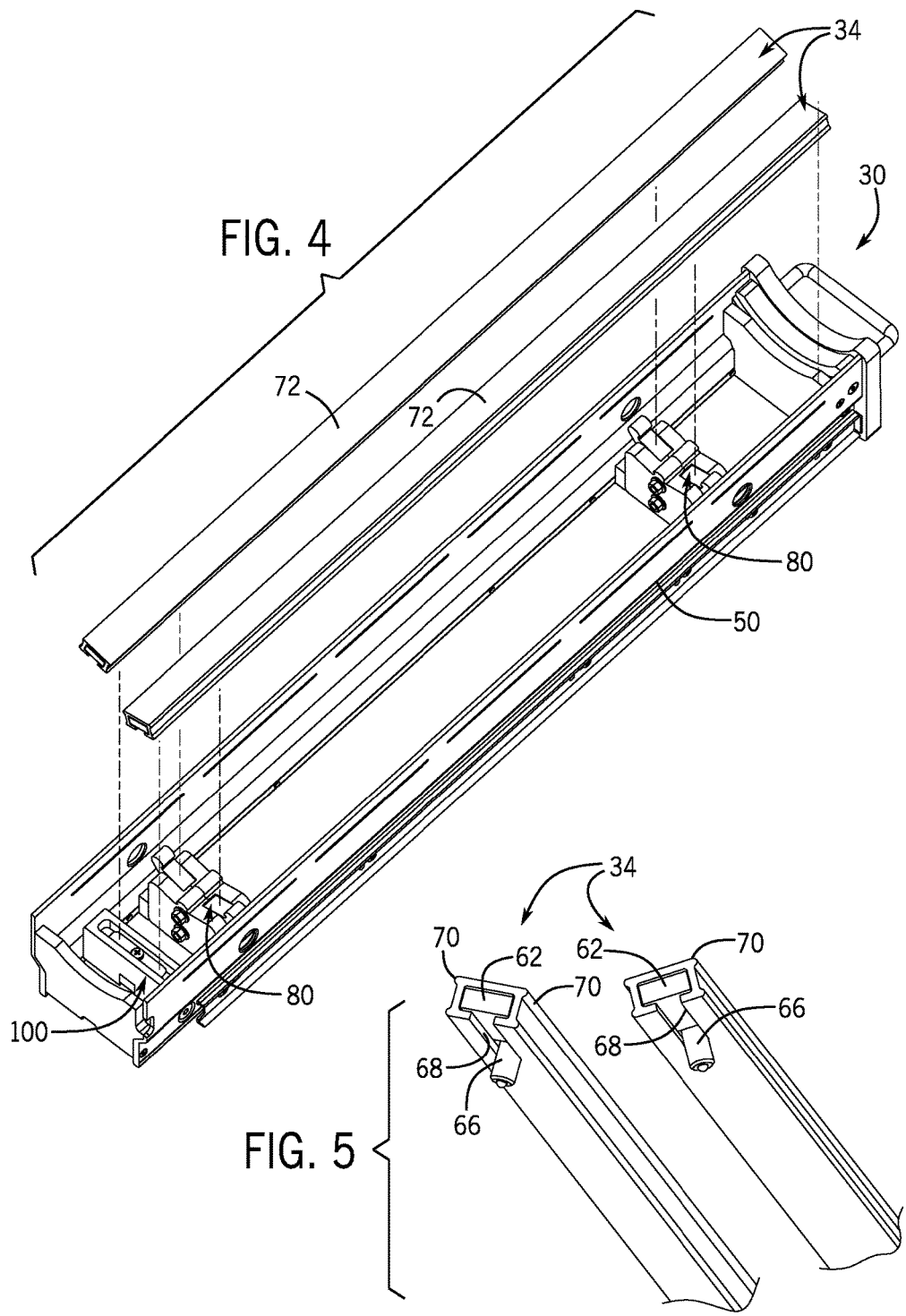

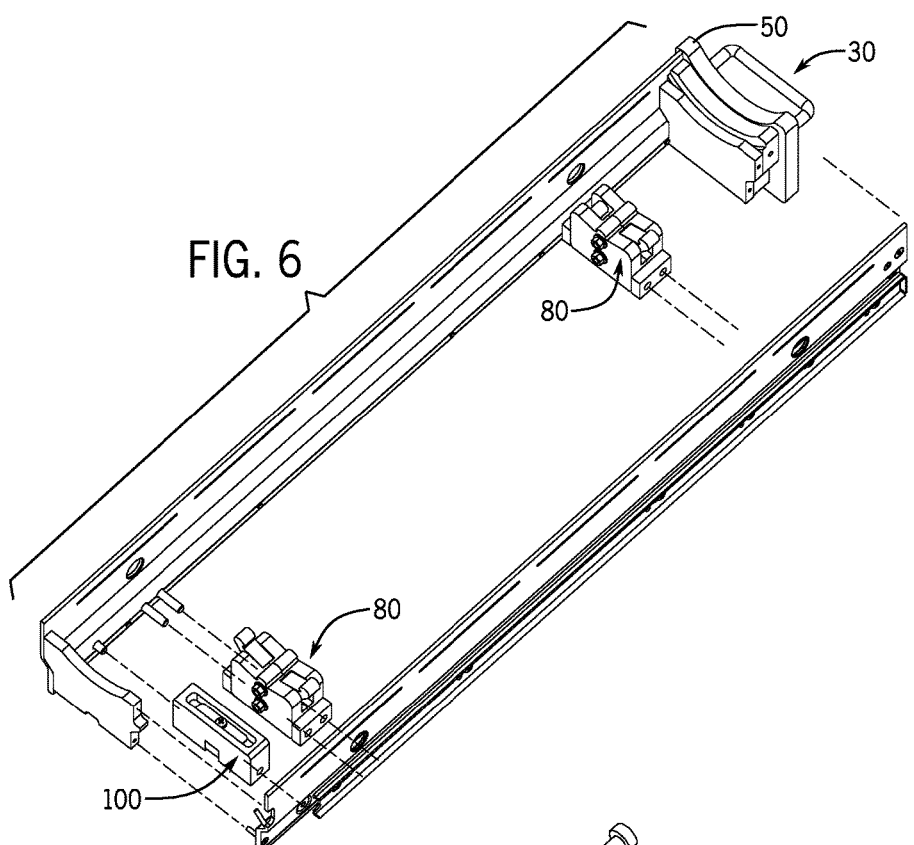
FIG. 6
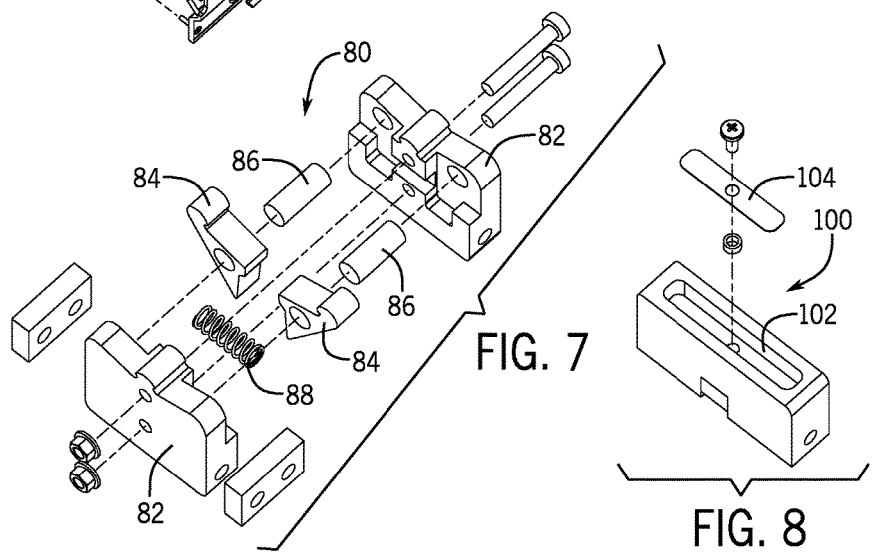
FIG. 7
FIG. 8

US 9,831,070 B1

SURFACE TREATER WITH EXPANSION ELECTRODE ARRANGEMENT

CROSS-REFERENCE TO RELATED APPLICATION(S)

Not applicable.

STATEMENT OF FEDERALLY SPONSORED RESEARCH OR DEVELOPMENT

Not applicable.

FIELD OF THE DISCLOSURE

This disclosure relates to surface treaters, and improvements to the electrode arrangements in surface treaters.

BACKGROUND OF THE DISCLOSURE

A number of techniques have been devised to clean, etch, deposit on and/or activate the surface of materials to improve various industrial processes (e.g., coating, gluing, dyeing, printing, lacquering, laminating, etc.). For example, some materials may inherently have poor bonding properties due to their inert or low-energy surfaces. Applying a stream of highly electrically conductive atomically or molecularly charged particles (i.e., positive or negative ions) to a material surface will increase the energy of the surface, and thereby improve its bonding performance. Generally, ionization may be effected by various chemical or physical means, including light interaction, subatomic (electrons, protons, neutrons, positrons, photons, etc.), atomic and/or molecular collisions, and radioactive decay.

Various industrial techniques (e.g., corona, chemical corona, plasma and flame treatments) apply high energy (e.g., via a high frequency power supply) to a process gas (e.g., air or a noble or other gas) to liberate electrons or other charged particles, which at least partially ionize the process gas. The various constituent parts (i.e., various charged and neutral atoms and molecules and various subatomic particles) of the resulting discharge (e.g., corona or plasma) react and collide with the material substrates to alter their surface energies.

Further, various sheet materials, such as paper and polymer webs and films, are often used in printing, coating and laminating applications. Treater stations have been devised to treat the surfaces of such sheet materials in a continuous manner as the material is unwound from its roll. The sheet material is passed through the treater station so that at least one surface passes through the electrical discharge from the electrode assembly, which may include one or more active electrodes that are mounted to the treater station and spaced by a narrow gap from a ground electrode in which the surface treatment occurs.

SUMMARY OF THE DISCLOSURE

An electrode mount, electrode arrangement and surface treater station are disclosed in which the one or more electrodes may be connected and disconnected in a simple and efficient manner. In some cases, the disclosed arrangements may serve to maintain a consistent gap (or discharge zone) between the electrodes and ground despite thermal expansion of the electrodes during operation of the surface treater.

According to one aspect, the disclosure provides an expansion mount for an electrode in a surface treater that includes a mounting block configured to be coupled to the surface treater, and one or more clamps pivotally coupled to the mounting block to move between a connect position and a release position. When the mounting block is coupled to the surface treater, the one or more clamps are configured to engage the electrode in the connect position and disengage from the electrode in the release position.

Another aspect of the disclosure provides an expansion electrode arrangement for a surface treater having at least one electrode and an expansion mount. A mounting block is configured to couple to the surface treater. One or more clamps pivotally couple to the mounting block to move between a connect position and a release position. The one or more clamps are configured to engage the at least one electrode in the connect position and disengage from the at least one electrode in the release position. When in the connect position, the one or more clamps mountingly engage with the at least one electrode while permitting the at least one electrode to move in the long dimension relative to the one or more clamps by thermal expansion of the at least one electrode.

Yet another aspect of the disclosure provides a surface treater station, including a roller electrode positioned to receive a web of material that passes over its outer surface, an active electrode having a discharge surface positioned adjacent the roller electrode and separated by a discharge gap, and an expansion mount having one or more clamps pivotally coupled to the treater station to move between a connect position and a release position. The one or more clamps engage the active electrode to mount to the treater station in the connect position and disengage from the active electrode in the release position. When in the connect position, the one or more clamps permit the active electrode to expand.

The details of one or more embodiments are set forth in the accompanying drawings and the description below. Other features and advantages will become apparent from the description, the drawings, and the claims.

BRIEF DESCRIPTION OF THE DRAWINGS

FIG. 2 is perspective of an electrode cartridge for the example surface treater of FIG. 1 including an example expansion electrode arrangement according to this disclosure;

FIG. 3 is another perspective view thereof;

FIG. 4 is a partially exploded assembly thereof showing a pair of electrodes exploded from expansion mounts;

FIG. 5 is a partial perspective view of ends of the electrodes shown in FIG. 4;

FIG. 6 is an exploded assembly view of the electrode cartridge as shown in FIG. 2;

FIG. 7 is an exploded assembly view of one example expansion mount thereof;

FIG. 8 is an exploded assembly view of one example contact block thereof;

Like reference symbols in the various drawings indicate like elements.

DETAILED DESCRIPTION

Figure 1:
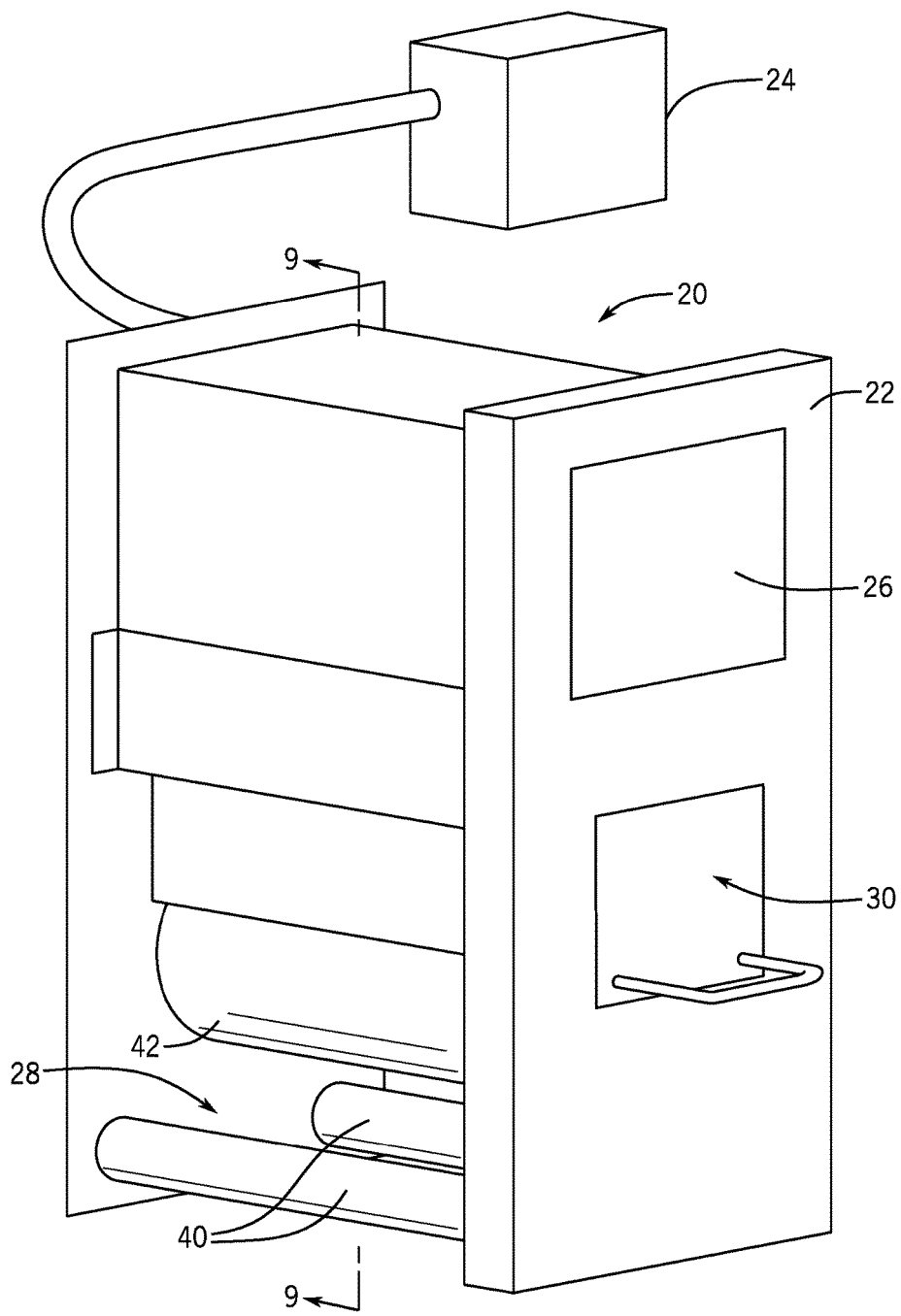
FIG. 1 is a simplified perspective view of an example surface treater station incorporating a tabless expansion electrode arrangement as disclosed herein.

The following describes one or more example embodiments of the disclosed surface treater and expansion electrode arrangement, as shown in the accompanying figures of the drawings described briefly above. Various modifications to the example embodiments may be contemplated by one of skill in the art.

As used herein, the "axial" direction may refer to a direction that is generally parallel to an axis of rotation, axis of symmetry, or centerline of a component or components. For example, in a cylinder with a centerline and opposite, circular ends, the "axial" direction may refer to the direction that generally extends in parallel to the centerline between the opposite ends. In certain instances, the term "axial" may be utilized with respect to components that are not cylindrical (or otherwise radially symmetric Also, as used herein, "radially" aligned may refer to two components that are both disposed along a line extending perpendicularly outward from a shared center line, axis, or similar reference. For example, two concentric and axially overlapping cylindrical components may be viewed as "radially" aligned over the portions of the components that axially overlap, but not "radially" aligned over the portions of the components that do not axially overlap. In certain instances, components may be viewed as "radially" aligned although one or both components may not be cylindrical (or otherwise radially symmetric).

Various surface treater stations and other surface treating devices improve the workability of certain materials (e.g., polymers, glass, ceramics, etc.) with chemical and structural properties (e.g., non-porosity, low surface tension, homopolarity, etc.) that may be unsuitable for certain industrial applications (e.g., coating, gluing, dyeing, printing, lacquering, laminating, etc.). Certain such surface treaters apply an electric potential across a gap filled with air or a particular gas (e.g., oxygen, nitrogen, a noble gas, etc.) to effect an at least partialized ionized discharge (e.g., corona, chemical corona, plasma (or "glow"), flame, etc.). The high energy and electrical conductively of the ionized discharge bombards the surface of a material substrate with charged subatomic, atomic and molecular particles that impart energy to, and raise the surface energy of, the material surface, thereby improving its industrial applicability.

Various factors dictate the effectiveness of the ionization process, and thereby the effectiveness of the treatment, including, for example, the selection of the process gas, the pressure of the process gas and the power applied to the process gas. The energy requirements for the electrodes also depend upon various other factors (e.g., type and size of the material being treated, process speeds, and so on). Generally, however, higher quality treatment at lower energies may be achieved with plasma treatment compared to chemical corona and further yet compared to corona. By way of example, of the three, the gases used to achieve plasma breakdown at the lowest energy, and thus may operate at the lowest voltage (e.g., 2-6 kV) and provide a relatively homogenous discharge cloud with little or no visible electrical filaments (or "streamers"). The uniform process gases used to achieve chemical corona have the next lower breakdown voltage and can be achieved with only a slightly higher input voltage (e.g. 6-8 kV). The higher breakdown voltage of air used in corona treatment requires the highest voltage (e.g., 10 kV). Both chemical corona and corona treatments are also more susceptible to aberrations and consequently may provide less uniform treatment than plasma treatment. Yet corona treatment generally provides macroscopic smoothing of the material surface and increases surface tension suitable for standard labeling, inking and lamination applications. More precise applications (e.g., photo processing) or highly polished or inert material surfaces may be better suited for plasma treatment.

As is understood, in all three treatment modes, the ionized discharge bombards the surface of the material substrate to convert its surface from a non-polar to a polar state in which molecules of the ionized discharge may bond to the molecules of the material surface. Put another way, electrons are accelerated into the surface of the substrate causing molecules (e.g., long molecular chains of polymers) to rupture, thereby increasing the number of available bonding points (e.g., ends of molecular chains) and free valences. Specifically, with respect to corona treatment, ozone produced by the electrical discharge oxygenates the substrate to form new carbonyl groups with a higher surface energy or tension. The result is an improvement of the chemical connection force (dyne) between the molecules in the substrate and an applied medium (e.g., adhesive, coating, etc.). Generally, the electrons dissociate at a higher rate and to a greater extent in plasma treatment, resulting in a greater increase in surface tension and stronger bonding properties for a given material.

Homogeneity and other aspects of the treatment may be improved (for any of the treatment modes) by controlling the conditions at the discharge, for example, by using a controlled discharge pressure. For example, low pressures (e.g., below atmospheric pressure) may facilitate discharge and enhance treatment. However, the associated evacuating system and confined discharge chamber of such low-pressure systems complicate and add expense to the system when compared to atmospheric ("air") plasma systems or corona systems. Moreover, while the plasma and chemical corona modes may provide improved treatments at lower energies when compared to corona, they both require a supply of non-air process gas as well as the associated flow control hardware. Therefore, the mode of treatment may be selected according to the type, sensitivity or precision of the material or application, such that plasma treatment (either atmospheric or low pressure) may be used for more demanding or sensitive applications and corona treatment may be used otherwise, such as for various common web and film applications.

Still further, for a given mode of treatment, generally, a greater number of discharges and/or higher power will provide greater ionization, and thus better treatment when compared to less discharges and/or lower power. However, this too presents a cost-benefit conundrum. More discharges require more or larger electrodes. To avoid this cost and complexity, a more robust power supply may be used provided the electrodes coupled to the power supply that effect the electrical discharge as well as their mounting components and other components in the vicinity of the discharge are able to withstand elevated temperatures (e.g., 150-400° C.) during operation.

For example, certain conventional corona treater stations have electrodes with dielectric (e.g., ceramic) tubes that are mounted to the treater station using (ceramic) mounting tabs. The tubes are connected to the mounting tabs by a commercially available high-temperature adhesive (e.g., silicone adhesive). The tubes and mounting tabs meet and exceed the aforementioned temperature requirements. However, the arrangement is limited by the temperature threshold of the adhesive, which may be less than temperatures associated with operating the surface treater at more desirable higher powers.

Beyond the electrodes and associated mounting components being a suitable high-temperature material, to utilize higher power power supplies these elements must also be able to operate properly at the associated elevated temperatures. In the aforementioned example, the dielectric tubes of the electrodes tend to change shape due to thermal expansion at and above certain temperatures. Specifically, the electrode tubes tend to elongate (i.e., increase in length in their long dimension) and may also expand slightly in cross-section. The electrodes or their mounting hardware may thus limit the useable power input because this thermal expansion (e.g., flexing or bowing) may alter the discharge gap (a controlled dimension for achieving proper discharge) between the active and ground electrodes. Over-sizing the gap to account for the thermal expansion may diminish performance or destroy the discharge. Even if possible, the electrode mounting hardware (and electrical connection) may complicate installation or replacement of the electrodes. Further, electrode cooling systems add cost and complexity to the surface treater as well.

This disclosure provides a surface treater with certain advantages over conventional systems, including to provide rapid and simple connection and disconnection of one or more electrodes, and in some cases, such quick and simple connection/disconnection without requiring the use of tools, thereby simplifying and shortening the time required for replacement, repair and cleaning of the electrode(s) and also reducing the likelihood of breaking or damaging the electrode(s) while undertaking replacement, repair and cleaning. In certain embodiments, the disclosed surface treater provides an expansion electrode arrangement in which the electrode(s) are mounted to the surface treater by mounting components that temporally change position to accommodate connection and disconnection of the electrode(s), again in an efficient manner and possibly without the use of tools. In certain embodiments, the mounting components of the expansion electrode arrangement may also allow for relative movement of the electrodes while in a mounted state, such as when the electrode(s) undergo thermal expansion during high operating temperatures. This latter benefit may allow the surface treater to be used with higher power power supplies. Thus, the "expansion" aspect of the disclosed electrode arrangement may be realized in the sense that the mounting features accommodate a temporary change in position for connection and disconnection of the electrode(s), such as by the transient movement (e.g., flexing and unflexing) of spring-biased features, and also in the sense that the mounting features allow for relative movement of the electrode(s) while mounted for operation in the surface treater.

As noted, certain embodiments of the disclosed expansion electrode arrangement mount the active electrodes in a floating connection that permits movement of the active electrodes relative to one or more components of the mounting hardware. In certain embodiments, the active electrodes may move in the direction of the long axis of the associated electrode (or width of the surface treater). This permits the active electrodes to elongate without flexing or bowing, thereby maintaining the controlled gap dimension between the active electrodes and the ground electrode. In certain embodiments, the active electrodes may also expand and move relative to one or more components of the mounting hardware in a direction perpendicular to the axial dimension, such as in either or both width and height dimensions of the active electrodes.

As also noted, certain embodiments of the disclosed expansion electrode arrangement accommodate thermal expansion and facilitate and expedite mounting/dismounting and electrical connection of the active electrodes. Certain embodiments of the disclosed expansion electrode arrangement also avoid the use of mounting tabs. Biased clamp expansion mounts allow each active electrode to mount to (and dismount from) the surface treater by hand without tools and without removing access panels. The biasing members apply a releasable (and in some cases variable) biasing force to retain each electrode. Each biasing member may be any suitable construction, such as a spring, a compliant part, a pneumatic or other cylinder, and so on. By way of example, the biasing member may be a spring forming a part of a spring clamp. The spring clamp expansion mounts provide a floating connection allowing axial elongation of the active electrodes and non-axial expansion against the spring bias without thermal expansion of the active electrodes causing substantial deviation from the critical gap dimension between the active and ground electrodes. In some embodiments, mating curved and angled flat surfaces between the active electrodes and the spring clamp engage in line contact to provide a self-centering mounting position that aids in maintaining the gap dimension. Further, a separate contact block may provide plug and play type electrical coupling of the active electrodes to the power supply during physical mounting of the electrodes to the surface treater.

Referring now to FIG. 1, an example surface treater station ("surface treater") 20 is shown in which the disclosed expansion electrode arrangement is incorporated. The disclosed expansion electrode arrangement may be capable of operating in a single mode providing a single discharge type or multiple modes providing multiple types of discharges. In the illustrated example, the surface treater 20 is a compact corona treater station, in which the process gas is air at atmospheric pressure, designed for treating narrow sheet materials in a continuous manner. Corona treaters in particular may benefit from the disclosed expansion electrode arrangement and its ability to accommodate the thermal effects resulting from the use of higher power power supplies. However, it will be understood that the disclosed expansion electrode arrangement may also be used with surface treaters with relatively low power power supplies, that provide other types of discharges (e.g., plasma discharge), and/or are configured to treat other types of (non-sheet) materials. Thus, the example surface treater 20 is presented merely to describe one example implementation of the disclosed expansion electrode arrangement, and is otherwise not limiting.

The surface treater 20 includes an upright frame and housing 22, a power supply 24, and, supported by the frame 22 a control interface 26, a roller arrangement 28 and an electrode cartridge 30 having an expansion electrode arrangement 32 according to the present disclosure with a pair of active electrodes 34. The compact form factor of the illustrated example is suited for narrow width substrates (e.g., under 36 inches), although in other embodiments wider substrates (e.g., 60 inches or more) may be accommodated. The frame and housing 22 support the roller arrangement 28, and the electrode cartridge 30 removably mounts to the frame and housing 22 through a front opening therein. A handle may be provided to facilitate removing and installing the electrode cartridge 30. Various cooling and ozone removal systems, with the associated hoods and flow plumbing (not shown), may be incorporated in or coupled to the surface treater 20, as known in the art.

The power supply 24 may be any suitable high-power power supply. For example, the power supply 24 may operate on standard single-phase input power at 50/60 Hz and provide a fixed or variable output power ranging about 5-100 kW at about 10-100 Kz or more. Three-phase input power may also be used. In some embodiments, the power output of the power supply 24 may be set or adjusted using the control interface 26. The power supply 24 may include various protective circuits (e.g., temperature, voltage or current limiters), as known in the art.

Figure 9:
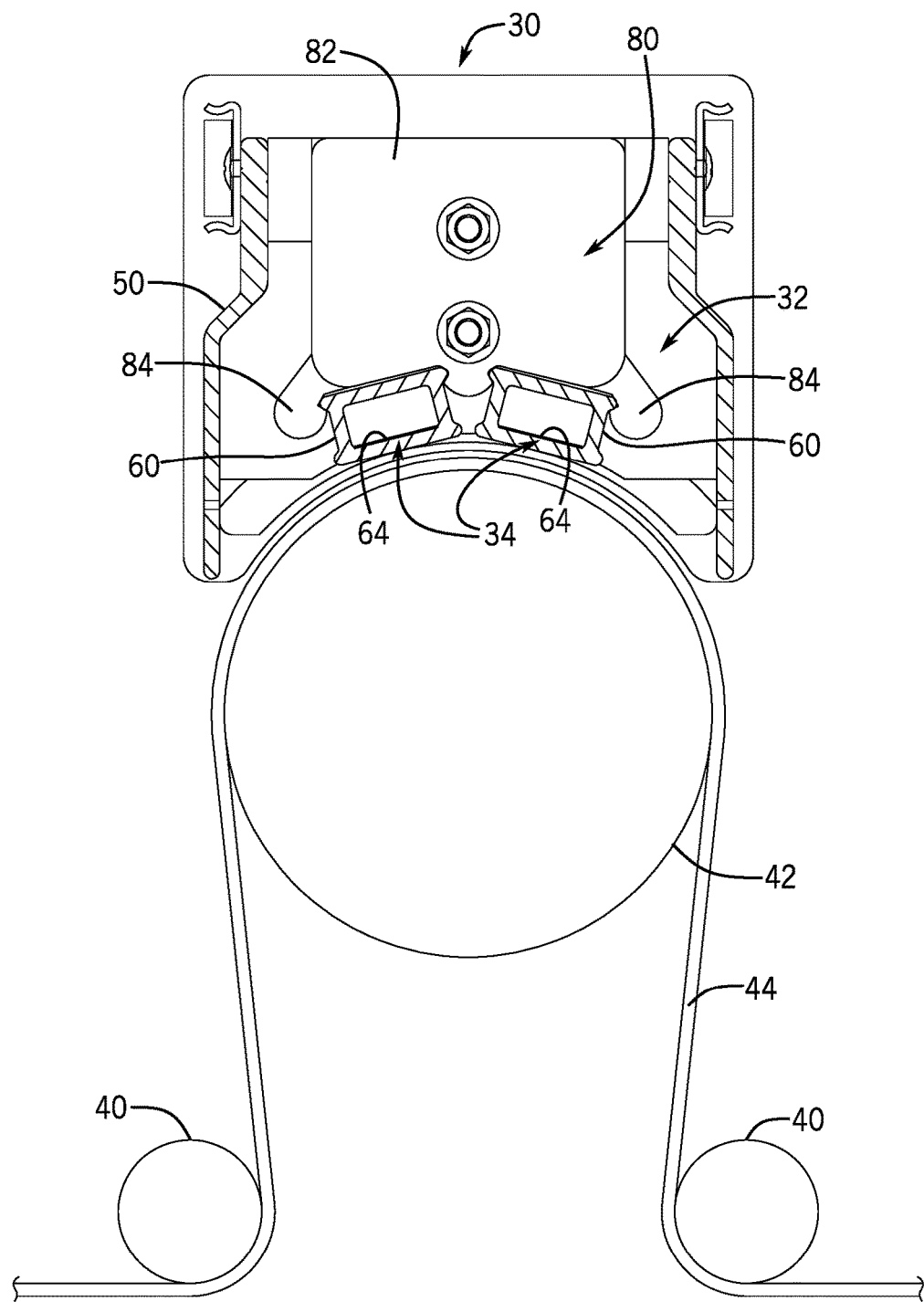
FIG. 9 is a partial end sectional view of the example expansion electrode arrangement of FIG. 2 in situ within the example surface treater station of FIG. 1 for treating a web material as taken along line 9-9 of FIG. 1.

The roller arrangement 28 includes a pair of feed rolls 40 and a larger diameter ground roll 42 (i.e., roller electrode or other non-roll ground electrode), all of which may be stationary or rotatable, either powered or unpowered. Sheet material 44 (e.g., various paper, film, foil and web substrates) may be fed through the feed rolls 40 and the ground roll 42 to pass within a discharge zone or gap 46 between the ground roll 42 and the electrode 34 of the expansion electrode arrangement 32 (see FIG. 9). The ground roll 42 may be made of an electrically conductive material (e.g., aluminum or stainless steel) with its electrically conductive surface exposed (i.e., "bare") or "covered" by a heat-resistive dielectric coating or wrap (e.g., a ceramic, silicone, epoxy, etc.). Certain ground roll materials may be better suited for treating certain substrates (e.g., covered rolls for electrically non-conductive films and bare rolls for electrically conductive films). However, the material selection may not be exclusively dependent on the substrate being treated (e.g., bare rolls may be used for both electrically conductive and non-conductive films).

Referring now also to FIGS. 2-6, the electrode cartridge 30 includes a header or shroud 50 (e.g., with long side walls and short end walls) that encloses the electrodes 34 from five sides other than at the bottom side, which opens toward the ground roll 42. In some embodiments, various forced air or vacuum hoods and plumbing lines may be coupled to the shroud 50 to provide process gas flow, cooling air, a vacuum, ozone removal and so on. Various discharge zone confining members (e.g., seals, gaskets, sweeps and so on) may be mounted to the shroud 50 to extend down and near or to the ground roll 42 to confine the discharge zone, and in some embodiments, a pressure chamber (e.g., a low-pressure chamber) may be created at the discharge zone. However, as mentioned, the illustrated example of the surface treater 20 uses air at atmospheric pressure without process gas flow, forced air cooling or ozone evacuation systems.

In the illustrated example, two electrodes 34 are mounted within the shroud 50 of the electrode cartridge 30, as will be detailed below. Other embodiments may include one or three or more electrodes. Each electrode 34 includes an elongated electrode tube 60, which, when mounted to the shroud 50, extends across substantially the entire width of the electrode cartridge 30, although with small gaps between the ends of the shroud 50. Each end of the electrode tubes 60 is closed by an end cap 62 (see FIG. 5). The electrodes 34 may be made entirely or in part of an electrically conductive material from which the electrical discharge emanates when the electrodes 34 are energized. Such electrodes may be more advantageous for various reasons (e.g., cost) or in certain applications (e.g., non-conductive webs). In the illustrated example, however, the electrode tubes 60 are made of a dielectric material, such as aluminum oxide (i.e., ceramic), that is electrically inert. In this case, each electrode 34 also includes a metallic electrode strip 64, which may be a suitable conductor or bus made of highly electrically conductive material (e.g., copper) lying within the interior of each electrode tube 60. Electrical contact terminals 66 couple to the electrode strip 64 and project outward at about right angles through opening or slots 68 near the ends of the electrode tubes 60. Other ways to pass the electrical current through the electrodes 34 may be possible (e.g., various metallic coatings, films or layers).

The electrodes 34 may be configured differently, or they may be substantially the same in length and/or cross-section, as in the illustrated example. To aid in achieving consistent and uniform dimensional characteristics (e.g., lengthwise trueness), particularly when using certain manufacturing processes (e.g., extruding processes), the electrodes 34, in particular the electrode tubes 60, may have a symmetric sectional configuration, such as illustrated. Certain manufacturing process that are less susceptible to deformation or other dimensional aberrations may allow for use of asymmetrical sectional configurations. Moreover, the electrodes 34, and particularly the electrode tubes 60, have a profile with one or more connection interfaces, or parts thereof, that serve to connect the electrodes 34 with associated mounting structure. The connection interfaces may be various male or female surfaces or structures configured to aid in physical engagement of the electrode tubes 60. In the illustrated example, the electrode tubes 60 have a generally rectangular cross-section with profiled corner extensions in the form of elongated (e.g., full-length) ribs 70 (shown as elongated convex beads) at each corner extending along a long dimension "L" of the electrode 34. The ribs 70 form one component of the connection interface at or between the electrode mounting structure, described below.

Each electrode 34 has a discharge surface 72 that faces the ground roll 42. When mounted, the electrodes 34 may be canted (i.e., angled relative to a central vertical reference plane "R" between the electrodes, see FIG. 10) to follow the circular surface of the ground roll 42 and to position the full width of the discharge surfaces 72 nearest to the surface of the ground roll 42. As noted, the gap 46 defines a treatment zone between the electrodes 34 and the ground roll 42. By way of example only, the gap 46 may be set between about 0.03 and 0.375 inches (perpendicular to the discharge surface 72) with the dimension depending on various factors (e.g., treatment mode, power input, material substrate, etc.). The gap 46 is a controlled dimension set to achieve proper discharge and treatment, and the gap 46 should be of a consistent dimension along the length of the electrodes 34, as variations may cause changes in the discharge that result in non-homogeneous surface treatment of the substrate (e.g., sheet material 44).

The electrode cartridge 30 also includes expansion mounts 80 (two in the illustrated example) that releasably connect the electrodes 34 to the shroud 50. The expansion mounts 80 are axially spaced apart to support the electrodes 34 near each end. The expansion mounts 80 may be fixed to the side walls of the shroud 50 (e.g., via threaded fasteners or other mechanical connection). The expansion mounts 80 may take various configurations sufficient to couple the electrodes 34 to the shroud 50 or other part of electrode cartridge 30 or the surface treater 20 and hold it firmly in close proximity to the ground roll 42 (spaced by the gap 46), while permitting the electrodes 34, specifically the electrode tubes 60, to expand. In other words, the expansion mounts 80 provide a non-rigid (or floating) connection that permits relative movement of the electrodes 34 with respect to the shroud 50 and/or the electrode cartridge 30.

Referring also to FIGS. 6, 7, 9, 10, 12 and 13, in the illustrated example, each of the expansion mounts 80 includes a multi-part mounting block 82 that may be assembled by threaded or mechanical fasteners and is bisected by the central reference plane R when mounted to the shroud 50. Each mounting block 82 may be made of a heat resistant, non-corrosive and non-conducting material (e.g., aluminum oxide, phenolic, etc.). A pair of clamp arms 84 are pivotally mounted to the mounting block 82 via pins 86 in mirror orientations with respect to the reference plane R. Note that a single clamp arm could be used in a single electrode arrangement, and more than two clamp arms could be used with more than two electrodes. One or more biasing members (e.g., the single compression spring 88 shown in the illustrated example) apply a spring force to (upper) inner wings of the clamp arms 84, such that their (lower) distal ends are biased inwardly toward the central reference plane R. The spring-biased clamp arms 84 thus apply a clamping force to the electrodes 34, and specifically the electrode tubes 60, when mounted. Further, the clamp arms 84 pivot between a connect position (see FIG. 15C) in which the clamp arms 84 engage the electrodes 34 and a release position (see FIG. 15D) in which the clamp arms 84 disengage from the electrodes 34. While the positions shown in FIGS. 15C and 15D illustrate example connect and release positions, it will be understood that there may be other such positions (e.g., for other electrodes) given that the clamp arms 84 may be moved against the biasing force continuously between opposite ranges of pivotal movement. The mounting arrangement may thus accommodate differently configured electrodes (e.g., electrodes having different cross-sectional dimensions) and may apply different or variable biasing forces (e.g., depending upon electrode configuration).

Figure 10:
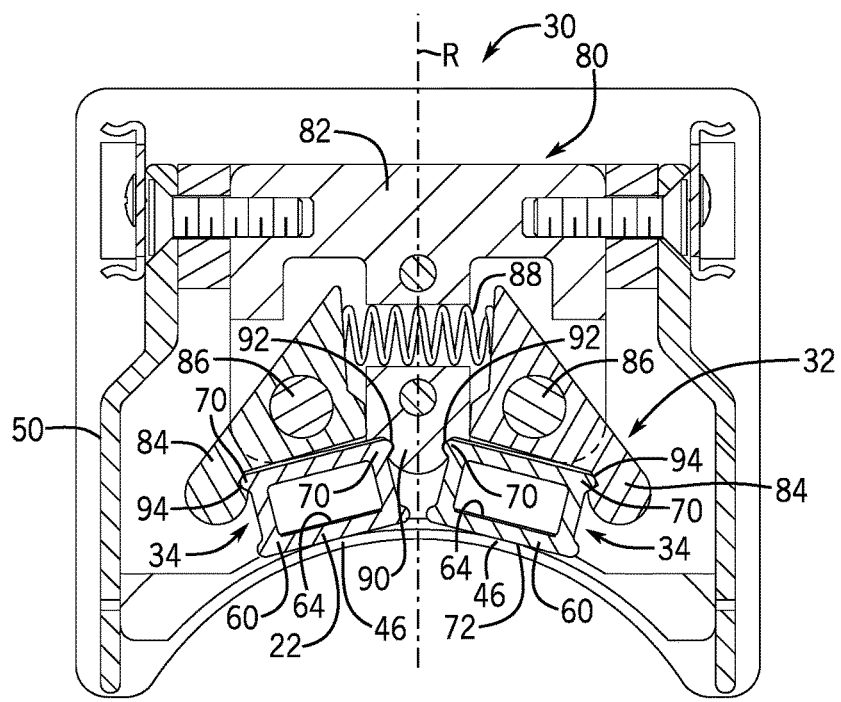
FIG. 10 is an end sectional view of the example electrode cartridge taken along line 10-10 of FIG. 2.
Figure 14:
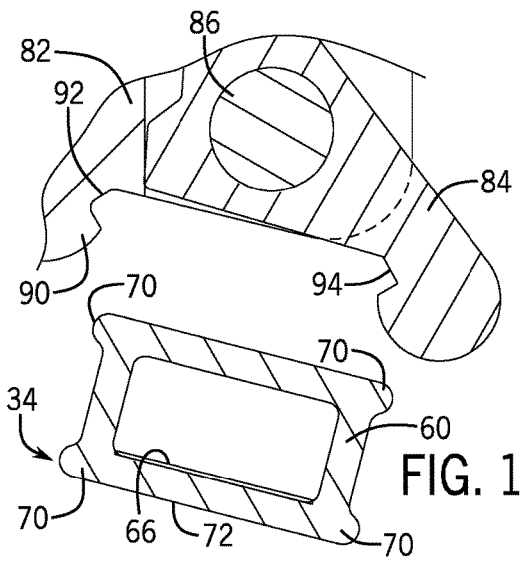
FIG. 14 is a partial, enlarged sectional detail view showing cross-sectional profiles of one electrode and one clamp arm of the example electrode cartridge of FIG. 2.

More specifically, and referring also to FIG. 14, mating parts of the mounting block 82 have recessed surfaces that, when mated, create open-sided hollow cavities for the spring 88 and in which move and from which extend (the distal ends of) the clamp arms 84. The mating parts of the mounting block 82 also define a central projection 90 against which the electrodes 34 are clamped by the clamp arms 84 when in the connect position. As depicted in FIG. 10, the central projection 90 defines seats 92 configured as axial (e.g., aligned with the long dimension L) notches that mate with the corner ribs 70 of the electrode tubes 60. The distal ends of the clamp arms 84 also defines seats 94 in the form of notches that mate with the corner ribs 70 of the electrode tubes 60. Each of the seats 92 engages with an inner upper corner rib 70, and each of the seats 94 engages with an upper outer rib 70, such as shown in FIG. 10. The seats 92, 94 are configured to, at least in part, support the associated rib 70 from an underside while also allowing for movement of the ribs 70 relative to the seats 92, 94 in the long dimension L, and thereby movement of the electrodes 34 relative to the expansion mounts 80 in the long dimension L. While various seat and rib configurations are possible, the seats 92, 94 may be angled (e.g., right angled) notches with flat surfaces that mated in line contact with the convex (e.g., circular) bead of the ribs 70. The "V" notches contact with the uniform radius of each convex surface along tangent lines, and in so doing, tend to self-center the ribs 70, and thereby consistently seat the electrodes 34 such that their discharge surfaces 72 are spaced from the ground roll 42 at the desired controlled dimension of the gap 46.

The expansion mounts 80 serve to maintain the full lengths of the electrodes 34 at a consistent spacing (i.e., the gap 46) relative to the ground roll 42 by accommodating for thermal expansion of the electrode 34, specifically the electrode tubes 60, at the elevated temperatures that arise from operation of the surface treater 20. More specifically, at the high temperatures associated with high power corona (or plasma) discharge, the electrode tubes 60 may elongate from thermal expansion because the mounting block 82 and the clamp arms 84 provide a floating connection that allows axial relative movement of the ribs 70 with respect to the seats 92, 94. The electrodes 34 thus elongate in one or both axial dimensions within the axial spacing between the ends of the electrodes 34 and the end walls of the shroud 50. This eliminates the deformation (lengthwise flex or bending) of the electrodes 34 that may be associated with rigid electrode mounts, and thereby, eliminates fluctuations in the gap 46 along the lengths of the electrodes 34 and any associated non-uniformity in the surface treatment. Moreover, the expansion mounts 80 accommodate cross-sectional enlargement of the electrode tube 60 due to thermal expansion by allowing for slight raising of the clamp arms 84 against the bias of the spring 88. Cross-sectional enlargement is believed to affect gap spacing less than elongation, yet even so, the expansion mounts 80 militate against any such associated change in gap distance.

Figure 15A:
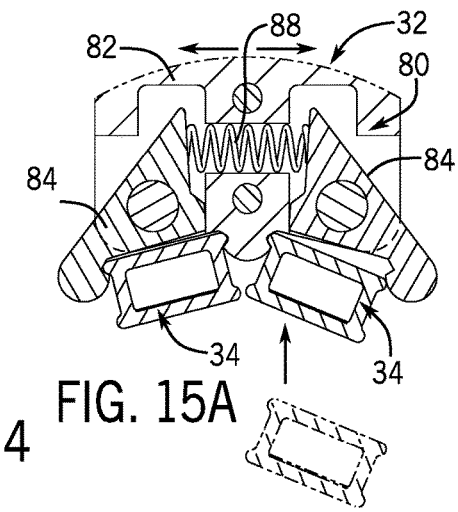
FIGS. 15A-15E are end sectional views illustrating example mounting and dismounting of the electrodes to the expansion mounts for the example electrode cartridge of FIG. 2.
Figure 15B:
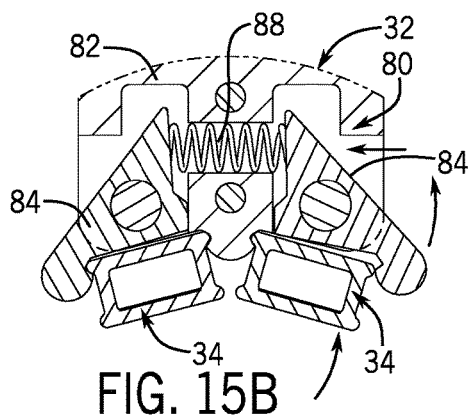
Figure 15C:
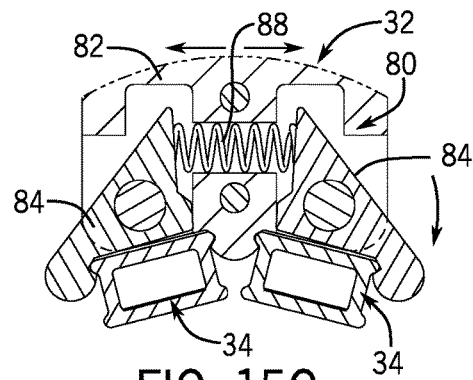
Figure 15D:
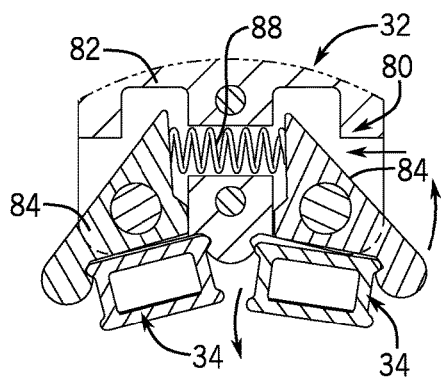
Figure 15E:
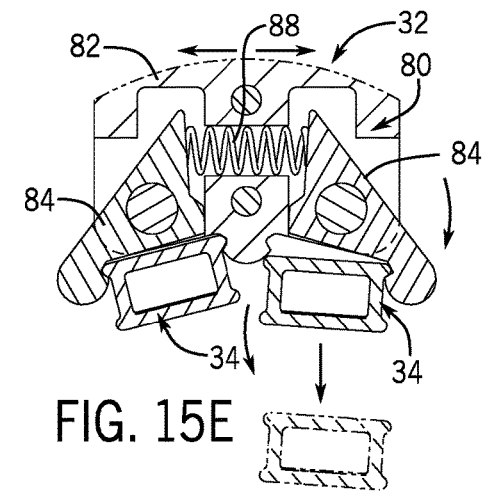

FIGS. 15A-15E illustrate an example mounting and dismounting sequence for one of the electrodes 34 (the right electrode in the figures). An electrode 34 may be mounted to an expansion mount 80 by first inserting the inner rib 70 into the seat 92 of the center projection 90 of the mounting block 82, as shown in FIG. 15A. The electrode 34 may then be pivoted about its long axis (counter-clockwise in FIG. 15B) so that the outer rib 70 presses on the distal end of the clamp arm 84 and pivots it (counter-clockwise) so that its inner wing compress the spring 88 until the rib 70 clears and fits into the seat 94. The spring 88 that pivots the clamp arm 84 to return (clockwise) and clamp against the electrode 34, as shown in FIG. 15C. The electrode 34 may be dismounted by again rotating the electrode 34 counter-clockwise to push the clamp arm 84 and compress the spring 88 until the clamp arm 84 pivots far enough counter-clockwise to clear the inner rib 70 from the seat 92, as shown in FIG. 15D. The outer rib 70 of the electrode 34 may be unseated and the electrode 34 may be dismounted, as shown in FIG. 15E. It should be noted that the entire mounting and dismounting process, as shown in FIGS. 15A-15E, may be undertaken by handling only the electrodes, as the clamp arms 84 may be displaced temporarily against the bias of the spring 88 via contact by the electrodes only.

Various spring rates may be used with expansion mounts 80 depending on the size and configuration of the clamp arms 84 and the electrodes 34. By way of example, generally a spring rate of 3-25 pounds/inch may be used in the illustrated example, with a spring rate of 10-15 pounds/inch providing a secure mounting of the electrodes while accommodating thermal expansion by allowing relative movement from elongation of the electrode tube 60 and/or spring compression due to cross-sectional enlargement of the electrode tube 60.

Figure 11:
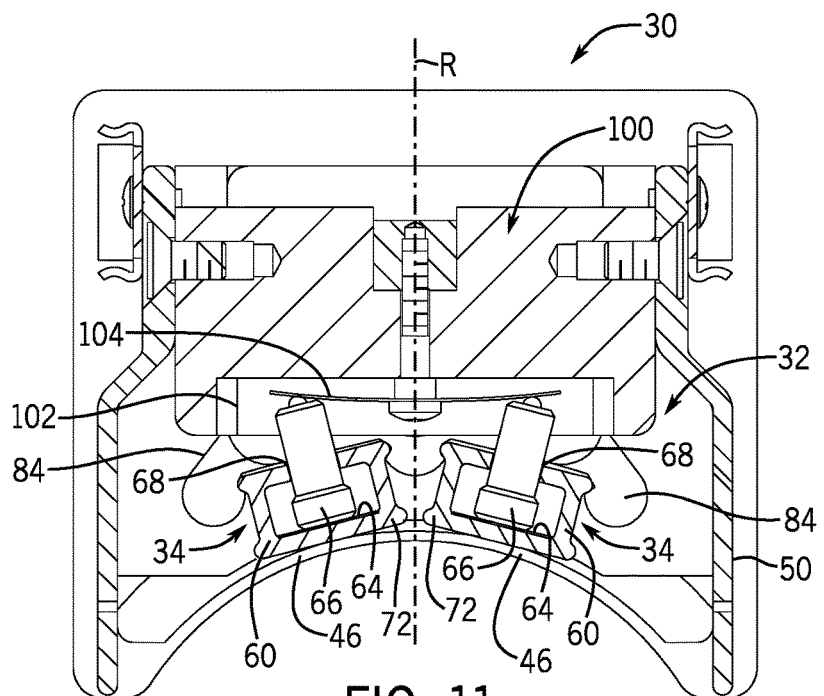
FIG. 11 is an end sectional view of the example electrode cartridge taken along line 11-11 of FIG. 2.
Figure 12:
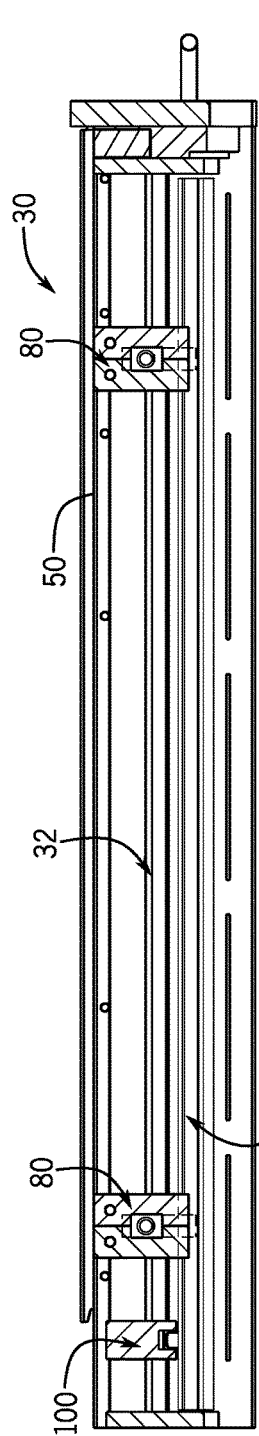
FIG. 12 is a side sectional view of the example electrode cartridge taken along line 12-12 of FIG. 2.
Figure 13:
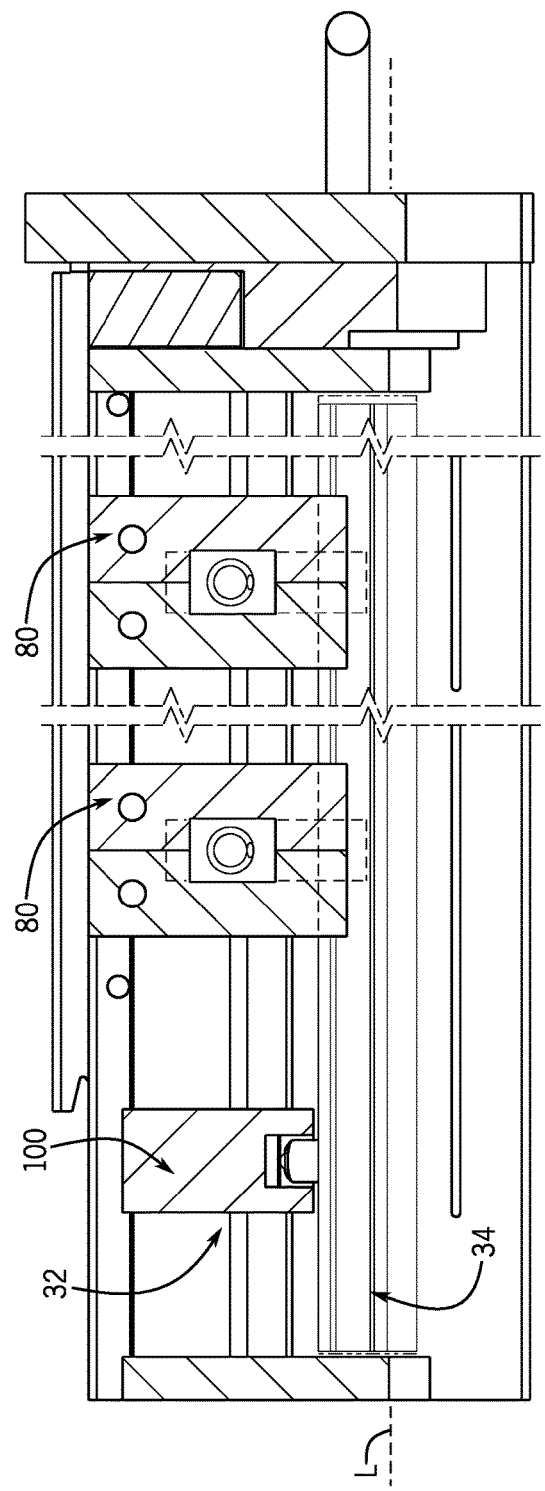
FIG. 13 is an enlarged, broken side sectional view thereof.

Referring now to FIGS. 8 and 11, the electrode cartridge 30 also includes a contact block 100, which may be made of a heat resistant, non-corrosive and non-conducting material (e.g., aluminum oxide, phenolic, etc.). The contact block 100 includes a recessed pocket 102 in which a conductor plate 104 is mounted (e.g., via a threaded fastener). The conductor plate 104 is connected to a terminal of the power supply 24. The contact block 100 is mounted to the shroud 50 at a location and position such that the contact terminals 66 of the electrodes 34 physically contact the conductor plate 104 when the electrodes 34 are mounted to the expansion mounts 80 and are physically disconnected when the electrodes 34 are dismounted, as described. No further electrical connection/disconnection is required to couple/uncouple the electrodes 34 to/from power. The conductor plate 104 may be any suitable conductor or bus made of highly electrically conductive material (e.g., stainless steel) and may have a spring rate that provides a bias tending to maintain the conductor plate 104 in contact with the contact terminals 66 of the electrodes 34.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the any use of the terms "comprises" and/or "comprising" in this specification specifies the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. Explicitly referenced embodiments herein were chosen and described in order to best explain the principles of the disclosure and their practical application, and to enable others of ordinary skill in the art to understand the disclosure and recognize many alternatives, modifications, and variations on the described example(s). Accordingly, various embodiments and implementations other than those explicitly described are within the scope of the following claims.

What is claimed is:

1. An expansion electrode arrangement for a surface treater, the expansion electrode arrangement comprising:
   at least one electrode; and
   an expansion mount, including:
     a mounting block configured to be coupled to the surface treater; and
     one or more clamps pivotally coupled to the mounting block to move between a connect position and a release position;
   wherein the one or more clamps are configured to engage the at least one electrode in the connect position and disengage from the at least one electrode in the release position; and
   wherein, when in the connect position, the one or more clamps mountingly engage with the at least one electrode while permitting the at least one electrode to move in the long dimension relative to the one or more clamps by thermal expansion of the at least one electrode.

2. An expansion mount for an electrode in a surface treater, the expansion electrode mount comprising:
   a mounting block configured to be coupled to the surface treater; and
   one or more clamps pivotally coupled to the mounting block to move between a connect position and a release position;
   wherein, when the mounting block is coupled to the surface treater, the one or more clamps are configured to engage the electrode in the connect position and disengage from the electrode in the release position.

3. The expansion mount of claim 2, wherein, when in the connect position, the one or more clamps permit the electrode to elongate by allowing movement in a long dimension of the electrode relative to the one or more clamps.

4. The expansion mount of claim 2, wherein, when in the connect position, the one or more clamps permit the electrode to expand in a dimension orthogonal to a long dimension of the electrode by pivotal movement of the one or more clamps with respect to the mounting block.

5. The expansion mount of claim 2, wherein the one or more clamps engage the electrode at one or more connection interfaces each including a seat configured to receive a profiled extension.

6. The expansion mount of claim 5, wherein each profiled extension is an elongated rib extending along a long dimension of electrode; and
   wherein each seat is defined by the one or more clamps and configured to at least in part to support the rib from an underside of the rib and allow for movement of the rib relative to the seat in the long dimension.

7. The expansion mount of claim 6, wherein the rib is a bead defining a convex surface, and the seat includes a notch configured to receive the bead and engage the convex surface along tangent lines.

8. The expansion mount of claim 7, wherein the convex surface of the bead has a uniform radius, and the notch of the seat is a V-notch.

9. The expansion mount of claim 2, further including one or more biasing members for at least one of applying a clamping force to the electrode and resisting movement in at least one direction of the one or more clamps with respect to the mounting block.

10. The expansion mount of claim 9, wherein the one or more clamps include a pair of clamps mounted in opposite orientations with respect to a central reference plane of the mounting block and having distal ends biased inwardly toward the central reference plane.

11. A surface treater station, comprising:
    a roller electrode positioned to receive a web of material that passes over its outer surface;
    an active electrode having a discharge surface positioned adjacent the roller electrode and separated by a discharge gap; and
    an expansion mount having one or more clamps pivotally coupled to the treater station to move between a connect position and a release position;
    wherein the one or more clamps engage the active electrode to mount to the treater station in the connect position and disengage from the active electrode in the release position; and
    wherein, when in the connect position, the one or more clamps permit the active electrode to expand.

12. The treater station of claim 11, wherein, when in the connect position, the one or more clamps permit the active electrode to elongate in a long dimension of the active electrode by allowing movement in the long dimension of the active electrode relative to the one or more clamps.

13. The treater station of claim 11, wherein, when in the connect position, the one or more clamps permit the active electrode to expand in a dimension orthogonal to a long dimension of the active electrode by pivotal movement of the one or more clamps with respect to the treater station.

14. The treater station of claim 11, wherein the one or more clamps engage the active electrode at one or more connection interfaces each including a seat configured to receive a profiled extension.

15. The treater station of claim 14, wherein each profiled extension is an elongated rib extending along a long dimension of the active electrode; and
   wherein each seat is defined by the one or more clamps and configured to at least in part to support the rib from an underside of the rib and allow for movement of the rib relative to the seat in the long dimension.

16. The treater station of claim 15, wherein the rib is a bead defining a convex surface, and the seat includes a notch configured to receive the bead and engage the convex surface along tangent lines.

17. The treater station of claim 16, wherein the convex surface of the bead has a uniform radius, and the notch of the seat is a V-notch.

18. The treater station of claim 11, further including one or more biasing members for at least one of applying a clamping force to the active electrode and resisting movement in at least one direction of the one or more clamps with respect to the treater station.

19. The treater station of claim 18, wherein the one or more clamps include a pair of clamps mounted in opposite orientations with respect to a central reference plane of a mounting block and having distal ends biased inwardly toward the central reference plane.

20. The treater station of claim 11, further including:
   an electrode shroud mounted to the treater station above the active electrode;
   wherein the mounting block is mounted to the electrode shroud.

* * * * *